United States Patent [19]

Myers et al.

[11] Patent Number: 5,896,335

[45] Date of Patent: Apr. 20, 1999

[54] METHOD AND APPARATUS FOR REDUCING POWER DISSIPATION IN A PRECHARGE/DISCHARGE MEMORY SYSTEM

[75] Inventors: Jeffrey Van Myers, Driftwood, Tex.; Nathan Elnathan, Rehovoth, Israel

[73] Assignee: Motorola, Inc., Schaumburg, Ill.

[21] Appl. No.: 08/862,662

[22] Filed: May 23, 1997

[51] Int. Cl.$^6$ ............................................. G11C 7/00
[52] U.S. Cl. ...................... 365/203; 365/189.02; 365/204
[58] Field of Search ................................ 365/203, 204, 365/227, 189.02

[56] References Cited

U.S. PATENT DOCUMENTS

| | | | |
|---|---|---|---|
| 5,572,477 | 11/1996 | Jung | 365/203 |
| 5,608,681 | 3/1997 | Priebe et al. | 365/204 |
| 5,642,314 | 6/1997 | Yamauchi | 365/203 |

OTHER PUBLICATIONS

Cozart, et al., Patent Application Serial No. 08/363,843, Filed Dec. 27, 1994, Will Issue Jun. 2, 1998 as U.S. Patent 5,761,700.

*Primary Examiner*—Son T. Dinh
*Attorney, Agent, or Firm*—Susan C. Hill

[57] ABSTRACT

Method and apparatus for selectively inverting memory bits (41–49) in a memory (14). In one embodiment a master reversion bit (75) is used to indicate if all memory bits (41–49) have been inverted. In an alternate embodiment, row reversion bits (77) are used to indicate whether the bits in a corresponding row have been inverted. In yet another embodiment, the reversion column reversion bit (202) may be used to indicate whether the row revert bits (77) themselves have been inverted. These control bits (75, 77, 202) determine whether the output from each column of memory (14) is inverted (i.e. reverted to its original logic state) in order to provide the correct logical state at the data output of memory (14).

25 Claims, 6 Drawing Sheets

METHOD AND APPARATUS FOR REDUCING POWER DISSIPATION IN A PRECHARGE/DISCHARGE MEMORY SYSTEM

FIELD OF THE INVENTION

The present invention relates in general to a precharge/discharge memory system, and more particularly to a method and apparatus for reducing power dissipation in a precharge/discharge memory system.

BACKGROUND OF THE INVENTION

In certain types of memory, such as a read only memory (ROM), memory cells are arranged in an array of n rows by m columns. During the manufacturing process, transistors are selectively constructed in the memory cells, depending upon an intended pattern. During operation, all column lines are periodically precharged. When a particular row is selected, if a transistor has been constructed in column j of that row, then column j will be discharged, thus consuming power during the next precharge cycle. In general, the greater the number of transistors constructed in the memory array portion of the ROM, the greater the amount of power that will be consumed during the operation of the ROM. In addition to the increased actual electrical current requirements, the increased power consumption requires commensurately higher heat dissipation capabilities.

With more and more electrical and computational equipment using batteries as their primary source of power, it is becoming increasing important to reduce the power consumed. In particular, for microcontrollers using on-board ROM, it is important to reduce the energy utilized by the ROM as much as possible. The reduction in power is also useful for applications in which a standalone ROM integrated circuit is used.

DESCRIPTION OF THE PREFERRED EMBODIMENTS

Figure 1:
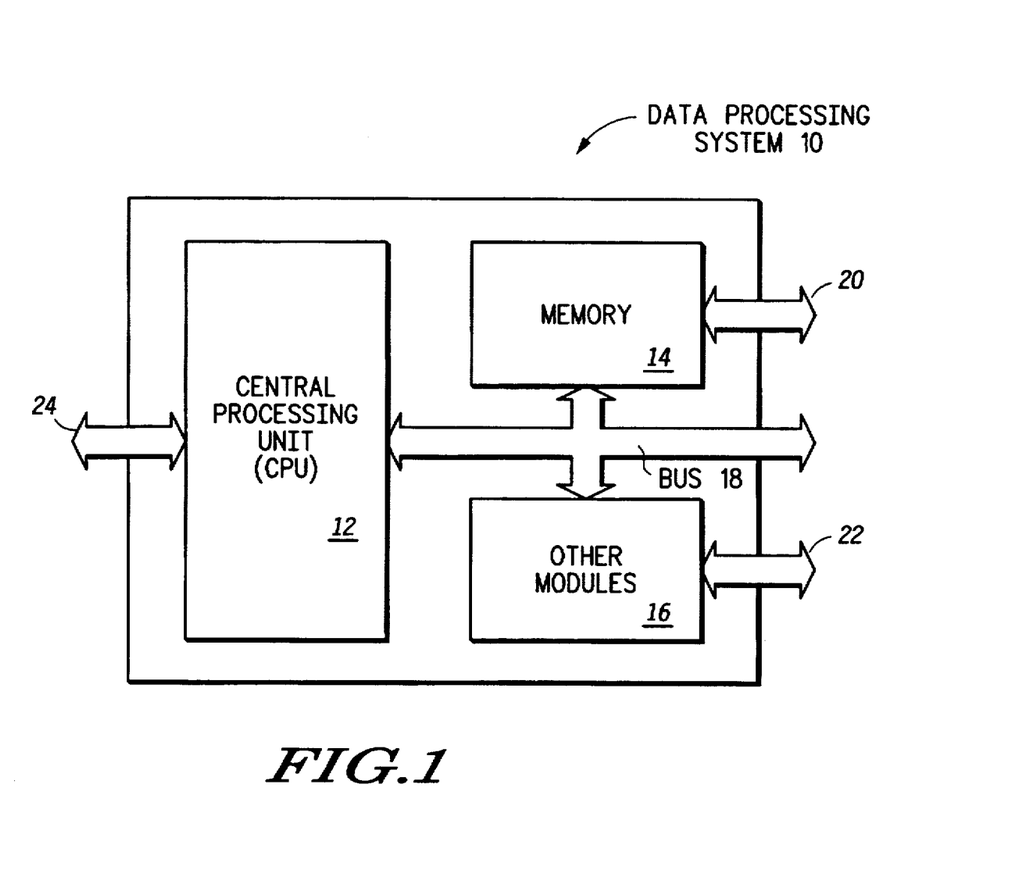
FIG. 1 illustrates, in block diagram form, a data processing system 10 having a memory 14 constructed in accordance with the present invention.

Description of FIG. 1

FIG. 1 illustrates one embodiment of a data processing system 10. In its embodiment, data processing system 10 includes a central processing unit (CPU) 12, a memory 14, and other modules 16, which are bidirectionally coupled by way of bus 18. Bus 18 may be coupled external to data processing system 10 by way of terminals (not shown). Central processing unit 12 may optionally be coupled externally to data processing system 10 by way of terminals 24. Memory 14 may optionally be coupled externally to data processing system 10 by way of terminals 20, and the other modules 16 may be optionally coupled externally to data processing system 10 by way of terminals 22. The other modules 16 may include any type of module that can be incorporated on an integrated circuit, such as a timer, a serial communication controller, an input/output port, an analog-to-digital converter, or any other type of functional block. Memory 14 may be any type of memory, so long as at least a portion thereof uses precharged/discharged data lines. One example of such a memory 14 is a conventional mask-programmable read only memory (ROM).

Figure 2:
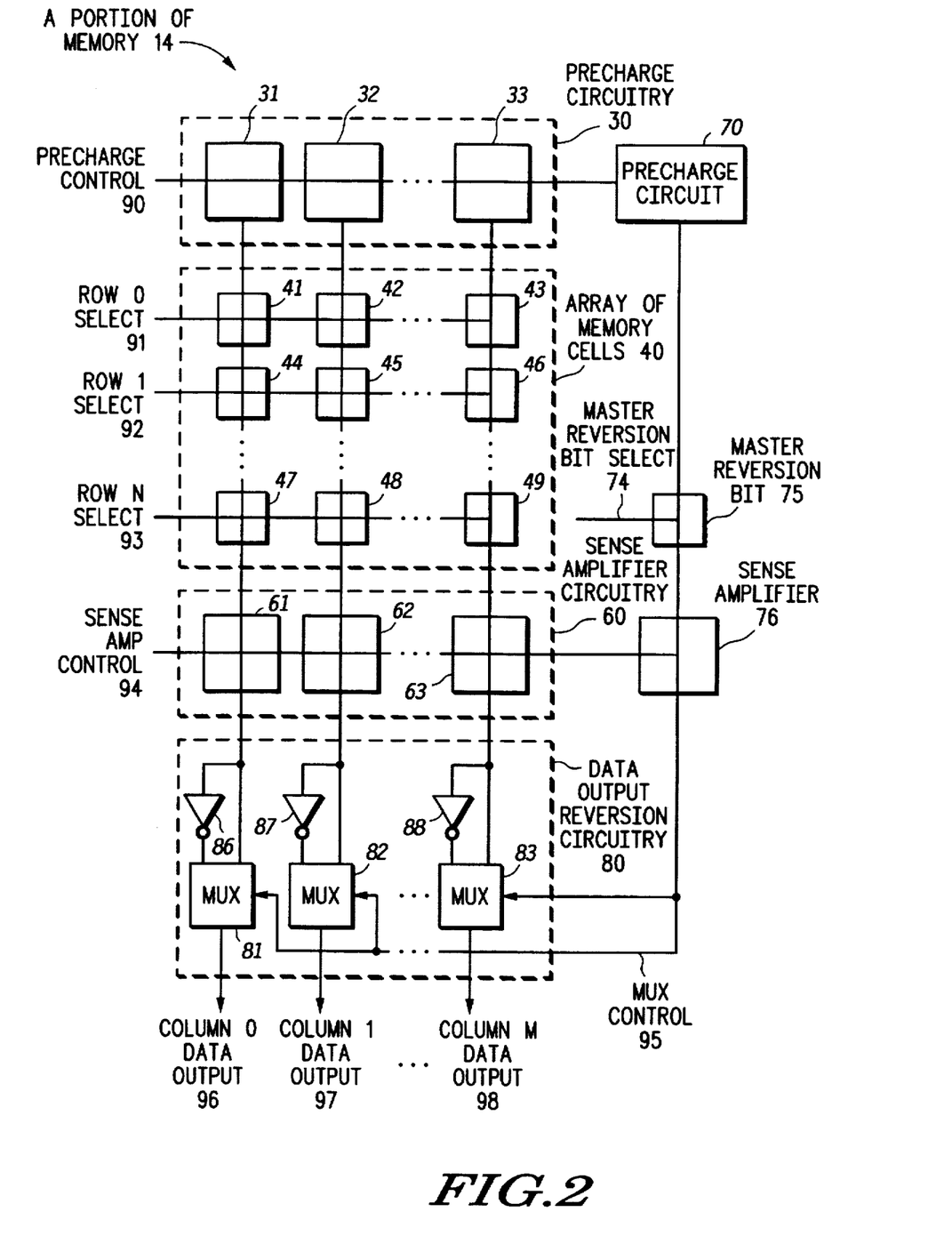
FIG. 2 illustrates one preferred embodiment of the memory 14 of FIG. 1.

Description of the Embodiment of FIG. 2

FIG. 2 illustrates one embodiment of the present invention in a mask-programmable read-only memory suitable for use as memory 14 of FIG. 1. In the illustrated embodiment, memory 14 includes precharge circuitry 30, an array of memory cells 40 arranged in n rows and m columns, and sense amplifier circuitry 60, all of which are conventional. However, alternate embodiments of the present invention may use any number of columns or rows. In the embodiment of the present invention illustrated in FIG. 2, precharge circuitry 30 includes precharge circuit 31 for column line 0, precharge circuit 32 for column line 1, and precharge circuit 33 for column line m. Precharge circuits 31 to 33 are connected to a precharge control line 90, and, in response to the assertion thereof, precharge column lines 0 to m, respectively.

In memory array 40, row 0 includes memory cells 41 through 43, row 1 includes memory cells 44 to 46, and row n includes memory cells 47 to 49. During manufacture, transistors (not shown) are constructed in selected memory cells 41 to 49 in accordance with a predetermined bit pattern. In row 0, the transistors constructed in memory cells 41 to 43 are connected to a row 0 select line 91, and, in response to the assertion thereof, selectively discharge the respective column lines 0 to m. In row 1, the transistors constructed in memory cells 44 to 46 are connected to a row 1 select line 92, and, in response to the assertion thereof, selectively discharge the respective column lines 0 to m. In row n, the transistors constructed in memory cells 47 to 49 are connected to a row n select line 93, and, in response to the assertion thereof, selectively discharge the respective column lines 0 to m.

Sense amplifier circuitry 60 includes a sense amplifier 61 for column line 0, a sense amplifier 62 for column line 1, and a sense amplifier 63 for column line m. Sense amplifier circuits 61 to 63 are connected to a sense amplifier control line 94, and, in response to the assertion thereof, sense the charge on the respective column lines 0 to m and provide respective output signals.

In accordance with the illustrated embodiment of the present invention, memory 14 includes an additional column m+1, comprised of a precharge circuit 70 for column line m+1, a single memory cell 75 (sometimes referred to hereinafter as the master reversion bit 75) in column m+1, and a sense amplifier 76 for column line m+1. Precharge circuit 70 is connected to the precharge control line 90, and, in response to the assertion thereof, precharges column line m+1. During manufacture, a transistor (not shown) may be constructed in memory cell 75 in accordance with the method of the present invention, to be described below. Memory cell 75 is coupled to a master reversion bit select line 74 which may, for example, be a logical OR of the row 0 to n select lines 91 to 93, respectively. Accordingly, in response to the assertion of any one of the row select lines 91 to 93, master reversion bit 75 selectively discharges column line m+1. Sense amplifier 76 is connected to sense amplifier control line 94, and, in response to the assertion thereof, senses the charge on the respective column line m+1 and provides an appropriate output signal via MUX (multiplexer) control line 95.

In addition, memory 14 includes data output reversion circuitry 80 comprising an inverter 8,6 and a MUX (multiplexer) 81 for column line 0, an inverter 87 and a MUX 82 for column line 1, and an inverter 88 and a MUX 83 for column line m. MUX 81 has a first input connected to the output of sense amplifier 61, a second input coupled to the output of sense amplifier 61 via inverter 86, and an output connected to column 10 data output line 96. MUX 82 has a first input connected to the output of sense amplifier 62, a second input coupled to the output of sense amplifier 62 via inverter 87, and an output connected to column 1 data output line 97. MUX 83 has a first input connected to the output of sense amplifier 63, a second input coupled to the output of sense amplifier 63 via inverter 88, and an output connected to column m data output line 98. MUXs 81 to 83 each have a control input connected to the MUX control line 95, and, in response to the negation or assertion thereof, coupled either the state or inverted state of the outputs of sense amplifiers 61 to 63, respectively, to respective column 0 to m data output lines 96 to 98.

Assuming that sense amplifiers 61 to 63 are of the inverting type, the discharge of a precharged column line 0 to m, resulting from the presence of a transistor in a selected memory cell 41 to 49, will result in the assertion of the output of the corresponding one of the sense amplifiers 61 to 63. For the purposes of the description which follows, it is therefore convenient to equate the presence of the transistor in a particular memory cell 41 to 49 as a logical 1 in the corresponding bit position of the pattern stored in the memory 14. Similarly, the absence of a transistor in a particular memory cell 41 to 49 may be equated as a logical 0 in the corresponding bit position of the pattern stored in the memory 14. Of course, if in a particular embodiment, the sense amplifiers 61 to 63 are of the non-inverting type, then the treatment of logical 0's and 1's in the following discussions must be reversed.

Operation of the Embodiment of FIG. 2

In accordance with the embodiment of the present invention show in FIG. 2, the number of transistors constructed in the memory cells 41 to 49 of array 40 of memory 14 may be reduced. If, in a particular situation, the number of transistors in the array 40 can be reduced, the number of times that each row is discharged will be correspondingly reduced and, thus, less power will be consumed by the memory 14. In general, before manufacture of the memory 14, the user can determine from the intended bit pattern to be constructed if more than half of the memory cells 41 to 49 will actually contain transistors. If so, it will, on average, be advantageous to invert all of the bits in the intended pattern and to cause a transistor to be constructed in memory cell 75. By thus asserting the master reversion bit 75, the MUX control line 95 will be asserted during each access to memory 14, and the output of sense amplifiers 61 to 63 will be reinverted via inverters 86 to 88 and MUXs 81 to 83, respectively. If, on the other hand, the original intended pattern does not require more than half of the memory cells 41 to 49 to contain transistors, it will, on average, be advantageous to preserve all of the bits in the intended pattern and to assure that no transistor in constructed in memory cell 75. By thus negating the master reversion bit 75, the MUX control line 95 will be negated during each access to memory 14, and the output of sense amplifiers 61 to 63 will be coupled directly to column 0 to m output lines 96 to 98 via MUXs 81 to 83, respectively. While this approach may, on average, result in a reduction in the number of column line discharges, this result is not assured.

Figure 3:
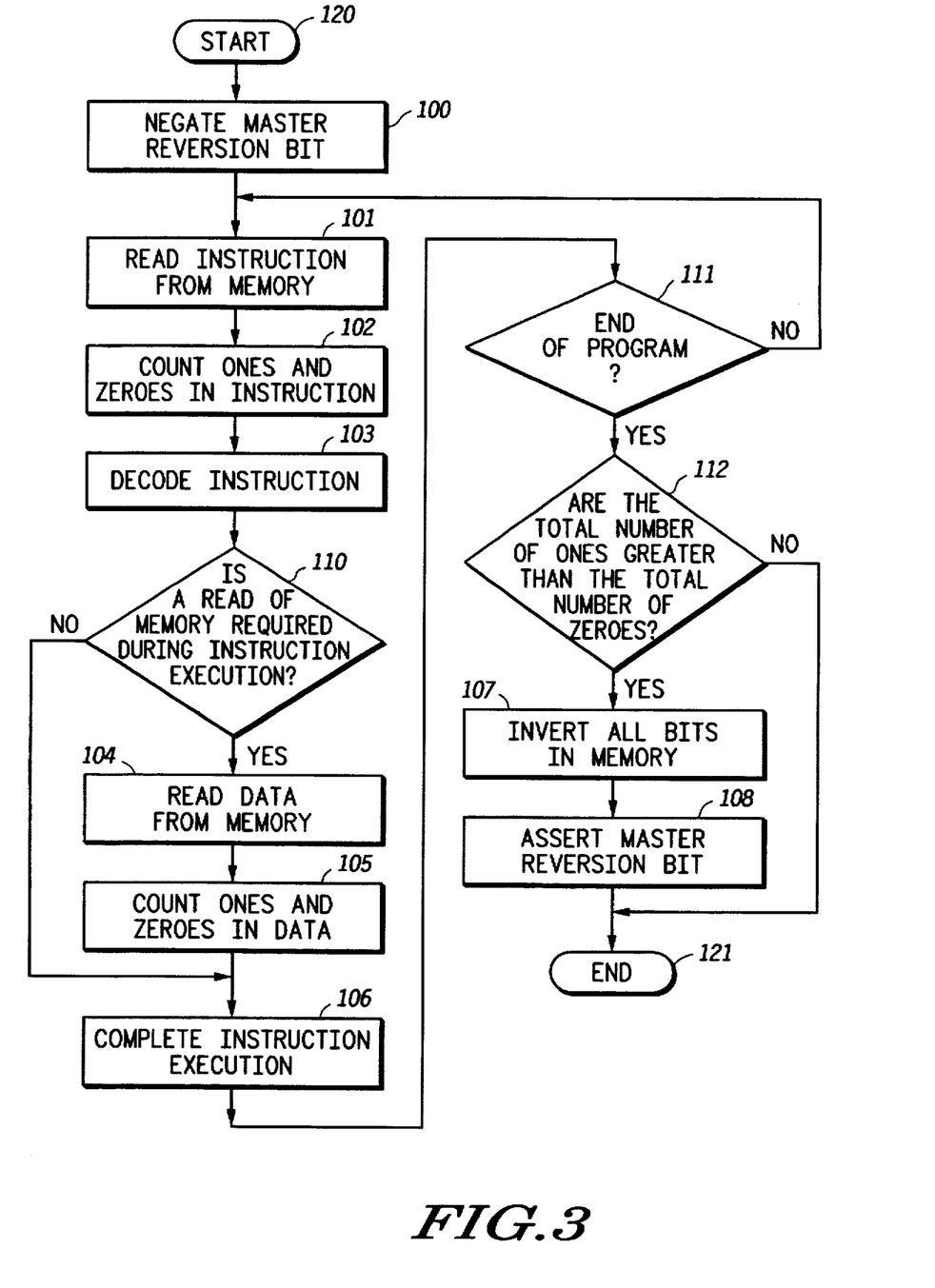
FIG. 3 illustrates, in flow diagram form, an approach for determining the memory cells in FIG. 2 in which to construct transistors during the manufacture of the memory 14.

FIG. 3 illustrates one alternate approach that may be used to determine if it will be advantageous to invert all of the bits in memory 14. It is anticipated that the approach of FIG. 3 will be practiced as an integral part of the process whereby the user of the memory 14 determines the bit pattern which is to be stored in the memory 14 in the manufacture thereof. For example, the illustrated approach may be performed on a conventional software development platform (not shown) typically used to develop and debug the code and data to be stored in the memory 14. In such a development environment, it is convenient to simulate the actual operation of the data processing system 10, including all accesses to memory 14. In the following description of the approach of FIG. 3, all reads of either instructions or data from the memory are as simulated on the development platform, and are not to be construed as actual accesses to memory 24 as finally manufactured.

In FIG. 3, rectangles 100–108 represent steps which are performed during one alternate approach that may be used to determine if it will be advantageous to invert all of the bits in memory 14. Oval 120 represent the starting point of the determination procedure, and oval 121 represents the finishing point of the determination procedure. Diamonds 110–112 represent decisional points in the determination procedure. Alternate embodiments of the present invention may use a different determination procedure.

The approach used in FIG. 3 starts with the assumption that the master reversion bit 75 will ultimately be negated. The next step is to read an instruction from the memory, and, then, to count the 1's and the 0's in that instruction. (Note that in this particular embodiment it is assumed that an instruction may include one or more rows from the memory.) The next step is to decode the instruction, and, then, to make a determination as to whether a read of data from the memory is required during instruction execution. If such a read is required, the desired data is read from the memory and the 1's and 0's in the data are also counted. (Note, in this counting process, no distinction is made between instructions and data: all 1's are totaled and all 0's are separately totaled.) After the data read and accounting, or if no data read is required, the instruction is executed. If the end of the user's program has not been reached, then the next instruction is read from memory and the steps of counting the 1's and 0's in the instruction and data are repeated.

When the end of the user's program has been reached, a determination is made as to whether the total number of 1's are greater than the total number of 0's. If the total number of 1's is not greater than the total number of 0's there is no need to do anything further, as a bit pattern inversion will probably not decrease the amount of power used. The original assumption as to the state of the master reversion bit 75 that is, negated, is thus made final. However, if the total number of 1's is greater than the total number of 0's, the inversion will probably result in a decrease in power. Accordingly, all of the bits in the memory are inverted and the master reversion bit 75 is asserted.

In the embodiment of the present invention shown in FIG. 2, there is a single master reversion bit 75 which indicates whether or not all of the bits in memory 14 have been inverted or not. If all of the bits in memory 14 have been inverted, the master reversion bit 75 is asserted. However, if none of the memory bits in memory 14 have been inverted, the master reversion bit 75 is negated. As explained above, the decision as to whether or not to invert the bits in the memory 14 to save power can be made based upon a simple static analysis of the intended bit pattern. More advantageously, using the approach of FIG. 3, this decision can be made based upon a dynamic analysis of the bit patterns expected to be accessed from memory 14 during actual operation of the data processing system 10.

Figure 4:
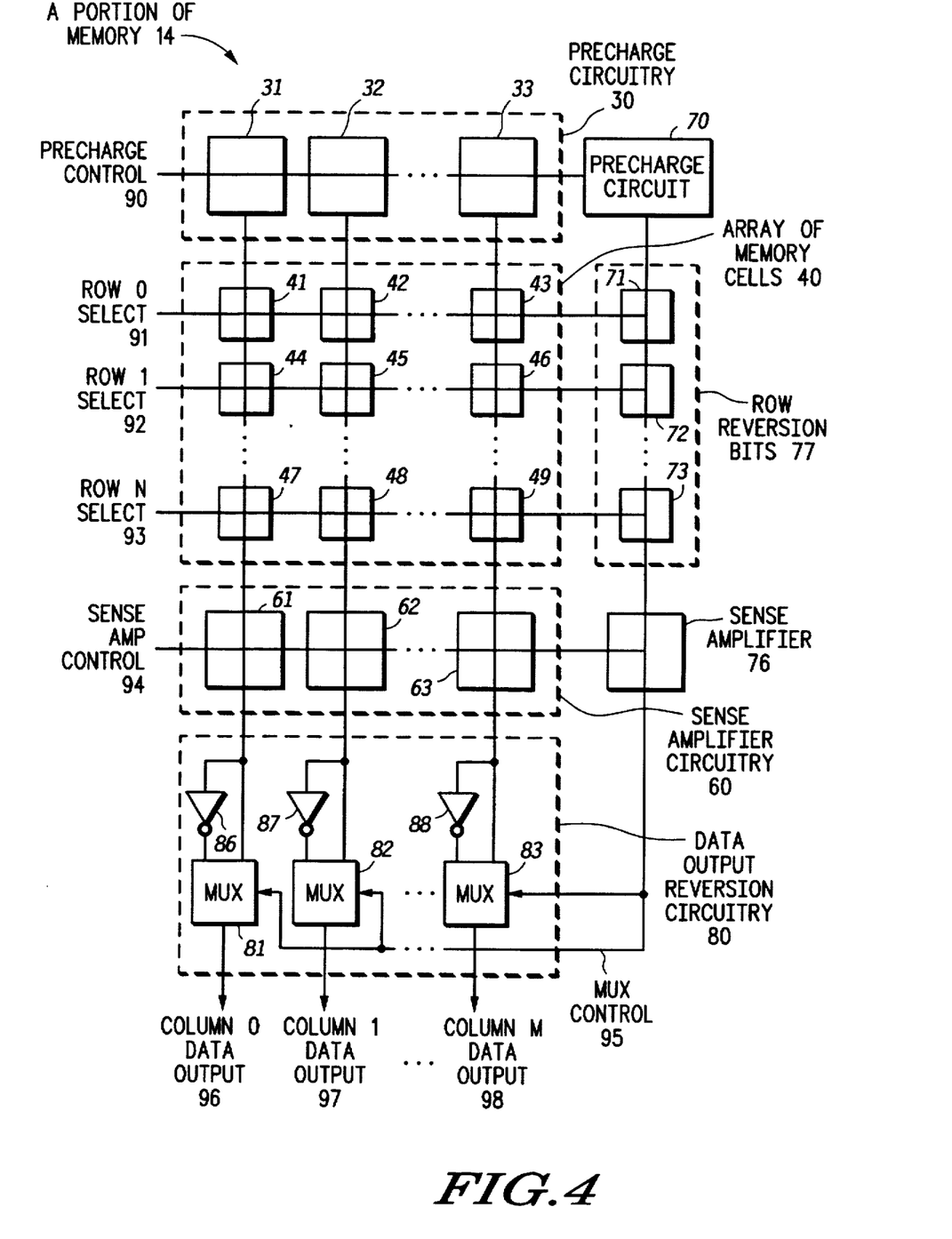
FIG. 4 illustrates another preferred embodiment of the memory 14 of FIG. 1.

Description of the Embodiment of FIG. 4

Shown in FIG. 4 is an alternate embodiment of the present invention which has certain advantages over the embodiment shown in FIG. 2, but at a somewhat higher cost in circuitry. In FIG. 4, all elements in common with the embodiment of FIG. 2 are similarly numbered and have identical functionality. In general, instead of utilizing a single memory cell 75 (see, FIG. 2), which acts as a master reversion bit 75, the embodiment of the present invention illustrated in FIG. 4 uses n memory cells 71 to 73 comprising row reversion bits 77. During manufacture, transistors (not shown) are constructed in selected memory cells 71 to 73 in accordance with the present invention as described below. Thus, for example, if in row 0 a transistor was constructed in memory cell 71, it would be connected to the row 0 select line 91, and, in response to the assertion thereof, would selectively discharge the column line m+1. Similarly, if in row 1 a transistor was constructed in memory cell 72, it would be connected to the row 1 select line 93, and, in response to the assertion thereof, would selectively discharge the column line m+1. Likewise, if in row n, a transistor was constructed in memory cell 73, it would be connected to the row n select line 93, and, in response to the assertion thereof, would selectively discharge the column line m+1.

Operation of the Embodiment of FIG. 4

In accordance with the embodiment of the present invention show in FIG. 4, the number of transistors constructed in the memory cells 41 to 49 of array 40 of memory 14 may be reduced. If, in a particular situation, the number of transistors in the array 40 can be reduced, the number of times that each row is discharged will be correspondingly reduced and, thus, less power will be consumed by the memory 14. In general, before manufacture of the memory 14, the user can determine from the intended bit pattern to be constructed if more than half of the memory cells 41 to 43 in row 0 will actually contain transistors. If so, it will, on average, be advantageous to invert all of the bits in the intended row 0 pattern and to cause a transistor to be constructed in memory cell 71. By thus asserting the row 0 reversion bit 71, the MUX control line 95 will be asserted during each access to row 0 of memory 14, and the output of sense amplifiers 61 to 63 will be reinverted via inverters 86 to 88 and MUXs 81 to 83, respectively. If, on the other hand, the original intended pattern does not require more than half of the memory cells 41 to 43 to contain transistors, it will, on average, be advantageous to preserve all of the hits in the intended row 0 pattern and to assure that no transistor in constructed in memory cell 71. By thus negating the row 0 reversion bit 71, the MUX control line 95 will be negated during each access to row 0 of memory 14, and the output of sense amplifiers 61 to 63 will be coupled directly to column 0 to m output lines 96 to 98 via MUXs 81 to 83, respectively. Applying this approach to each of the remaining rows 1 to n will result in a reduction in the number of column line discharges.

Figure 5:
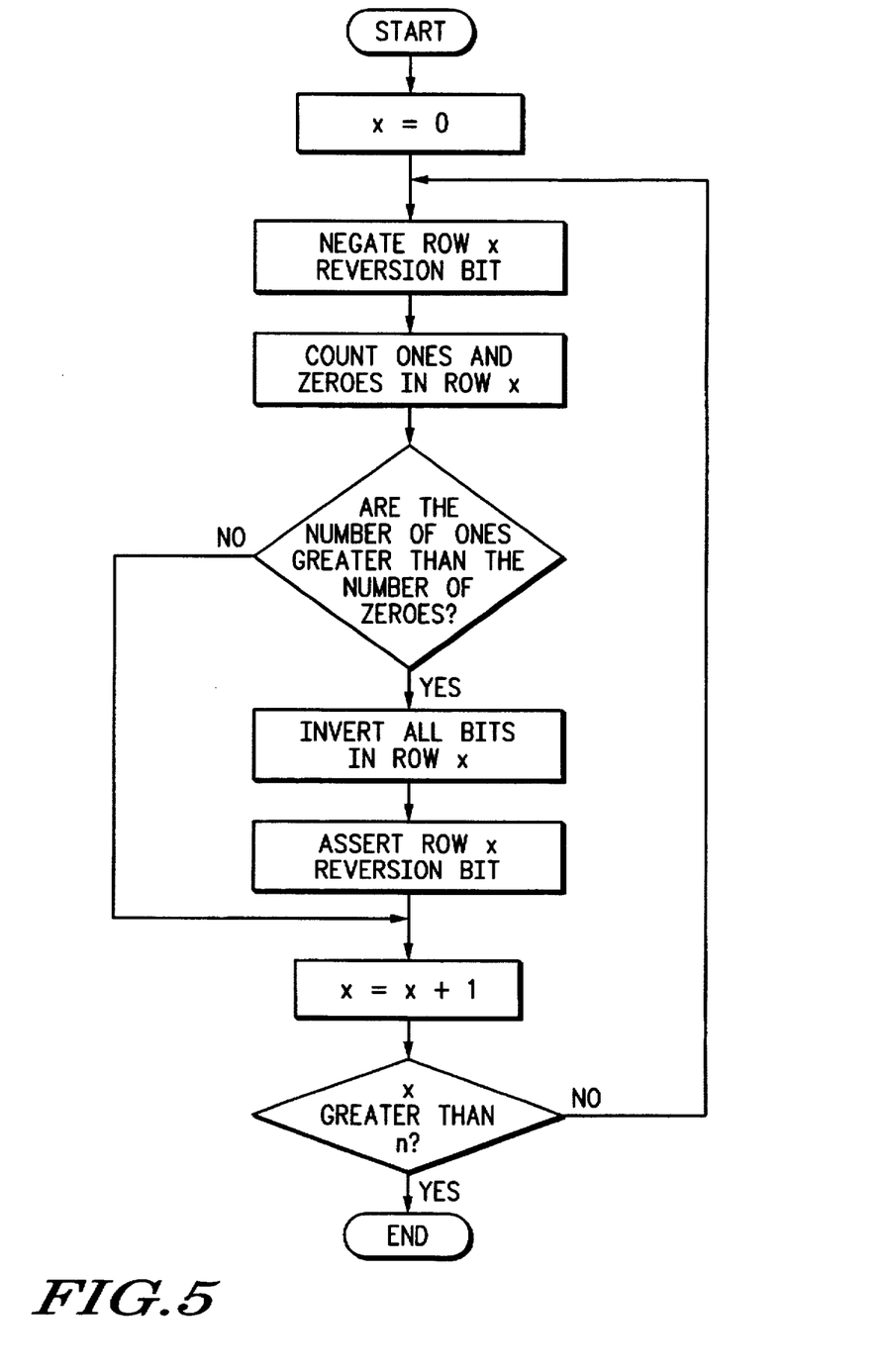
FIG. 5 illustrates, in flow diagram form, an approach for determining the memory cells in FIG. 4 in which to construct transistors during the manufacture of the memory 14.

FIG. 5 illustrates this approach to determine if it will be advantageous to invert all of the bits in any of the n rows of memory 14. It is anticipated that the approach of FIG. 5 will be practiced as an integral part of the process whereby the user of the memory 14 determines the bit pattern which is to be stored in the memory 14 in the manufacture thereof. For example, the illustrated approach may be performed on a conventional software development platform (not shown) typically used to develop and debug the code and data to be stored in the memory 14. In such a development environment, it is convenient to practice the approach of FIG. 5 after the intended bit pattern has been developed but before the pattern is submitted for manufacture. Alternatively, this approach may be applied by the manufacturer of the memory 14 as a routine part of the manufacturing process.

The approach used in FIG. 5 is intended to be applied once to each of the n rows of memory 14. For example, for row 0, it is initially assumed that the respective row reversion bit 71 will ultimately be negated. The next step is to determine whether the total number of 1's in the row 0 bit pattern are greater than the total number of 0's. If the total number of 1's is not greater than the total number of 0's there is no need to do anything further, as a bit pattern inversion will not decrease the amount of power used. The original assumption as to the state of the row 0 reversion bit 71, that is, negated, is thus made final. However, if the total number of 1's is greater than the total number of 0's, the inversion will result in a decrease in power. Accordingly, all of the bits in the memory are inverted and the row 0 reversion bit 71 is asserted. Repeating this process, the bit patterns of rows 1 to n of the memory 14 are similarly examined and the respective row reversion bits 77 asserted or negated accordingly.

Unlike the dynamic approach of FIG. 3, which determines an average discharge rate, the static analysis approach of FIG. 5 will provide a minimum discharge rate for the memory array 40. However, as will be seen below, it may be possible to further reduce the total power consumption for the memory 14 as a whole.

Figure 6:
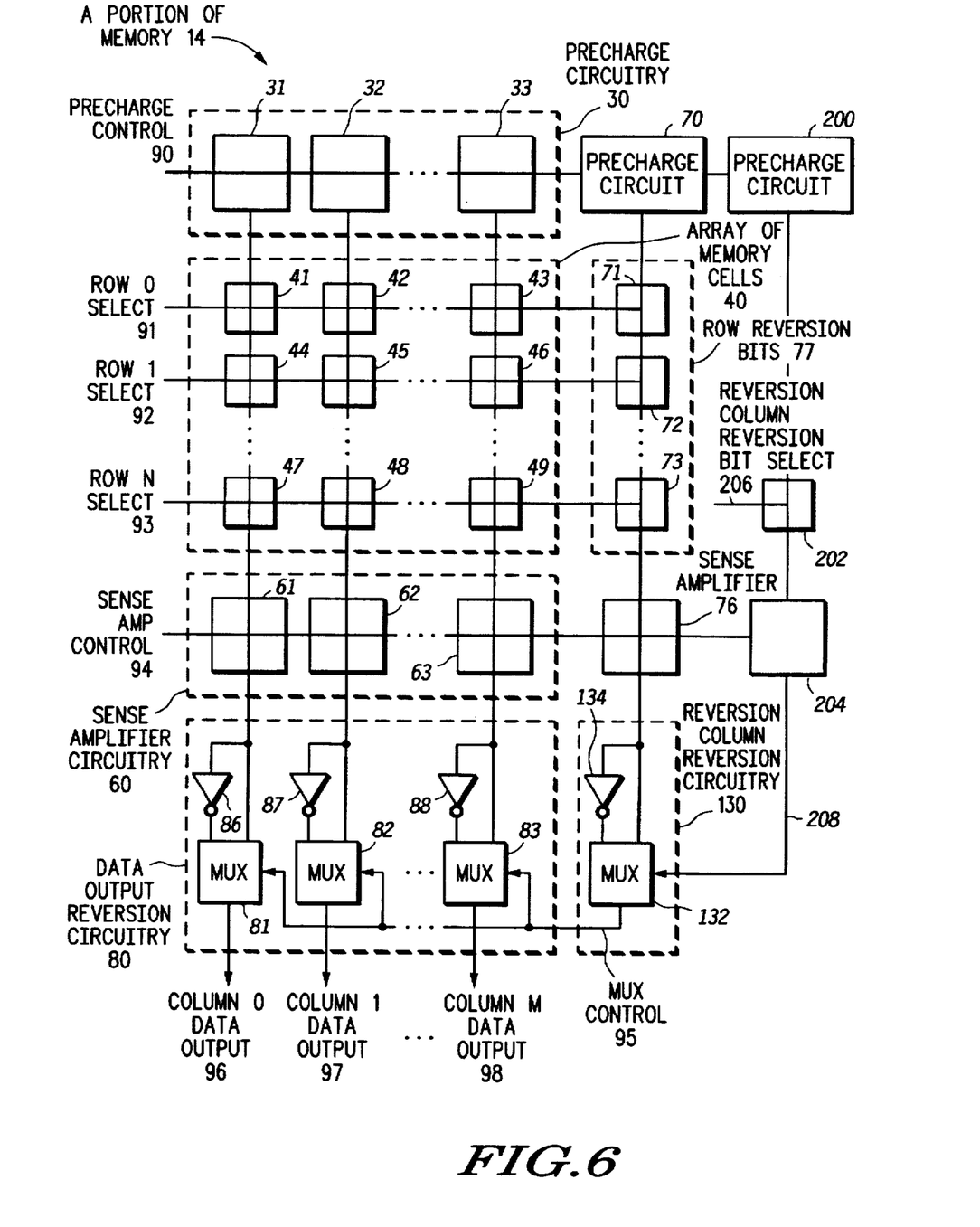
FIG. 6 illustrates yet another preferred embodiment of the memory 14 of FIG. 1.

Description and Operation of the Embodiment of FIG. 6

FIG. 6 illustrates yet another alternate embodiment of the present invention, which is an advantageous combination of certain aspects of the embodiments of FIG. 2 and FIG. 4. As explained above and except as indicated, all elements in FIG. 6 which are in common with the embodiments of FIG. 2 and FIG. 4 are similarly numbered and have identical functionality. Thus, for example, the memory 14 of FIG. 6 includes a column m+1 of row reversion bits 77 that are configured as described above with respect to the embodiment illustrated in FIG. 4. Note, however, that the output of sense amplifier 76 is now coupled to the MUX control line 95 via reversion column reversion circuitry 130, comprising MUX 132 and inverter 134.

In addition, in a manner analogous to the embodiment illustrated in FIG. 2, the embodiment shown in FIG. 6 includes an additional column m+2, comprised of a precharge circuit 200 for column line m+1, a single memory cell 202 (sometimes referred to hereinafter as the reversion column reversion bit 202) in column m+2, and a sense amplifier 204 for column line m+2. Precharge circuit 200 is connected to the precharge control line 90, and, in response to the assertion thereof, precharges column line m+2. During manufacture, a transistor (not shown) may be constructed in memory cell 202 in accordance with the method of the present invention, to be described below. Memory cell 202 is coupled to a reversion column reversion bit select line 206 which may, for example, be a logical OR of row 0 to n select lines 91 to 93, respectively. Accordingly, in response to the assertion of one of the row select lines 91 to 93, reversion column reversion bit 202 selectively discharges column line m+2. Sense amplifier 204 is connected to sense amplifier control line 94, and, in response to the assertion thereof, senses the charge on the respective column line m+2 and provides an output signal to the MUX 132 in the reversion column reversion circuitry 130 via MUX control line 208.

As described above with respect to the embodiment shown in FIG. 4, the initial configuration of row reversion bits 77 is determined in accordance with the bit counts in the respective rows of the intended bit pattern, as illustrated in FIG. 5. In contrast, however, one of the approaches described above with respect to the embodiment shown in FIG. 2 is then applied to the row reversion bits 77. For example, using an analogous static approach, the row reversion bits 77 may simply be counted, and, if there are more 1's than 0's, all of the row reversion bits 77 should be inverted and the reversion column reversion bit 202 asserted to revert the row reversion bits 77 back to their original states. Similarly, using a dynamic approach analogous to that shown in FIG. 3, the software development platform (not shown) may be employed to determine the expected frequency of 1's and 0's of the row reversion bits 77 during actual operation of the data processing system 20. If this simulated count indicates that more row reversion bits 77 having a logic 1 state will be accessed than row reversion bits 77 having a logic 0 state, the row reversion bits 77 may be inverted and the reversion column reversion bit 202 asserted to revert the row reversion bits 77 back to their original states. In such a combined approach, the method of FIG. 5 with minimize the power consumption of the memory array 40 and the method of FIG. 3 will reduce, on the average, the power dissipation of the row reversion bits 77.

Additional Embodiments

If desired, the master reversion bit 75 of FIG. 2, the row reversion bits 77 of FIG. 3 or FIG. 4, or the reversion column reversion bit 202 of FIG. 6 may be implemented in a user programmable control register. For example, master reversion bit 75 may be implemented as a user programmable control register so that it may be asserted and negated under program control. In such an embodiment, memory 14 may have selected rows that have been inverted while other rows have not been inverted. Then, during program execution, the user's program may dynamically assert or negate the master reversion bit 75 based upon which row (i.e. location) in memory 14 is being accessed. Of course, the user must keep track in the program code as to which rows in memory 14 have been implemented in their inverted state. The user must then properly assert and negate the master reversion bit 75 before a row of memory 14 is accessed. Thus, the master reversion bit 75 of FIG. 2, the row reversion bits 77 of FIGS. 4 and 5 and the reversion column reversion bit 202 of F1G. 6 may be implemented as an integral part of memory 14 or may be implemented as part of a separate structure such as a user programmable control register.

In addition or in the alternative, if desired, the master reversion bit 75, the row reversion bits 77, and the reversion column reversion bit 202 may be implemented as control bits that are hidden from an unauthorized user in order to provide a security feature. Without knowledge of the state of the revision bit(s), it is very difficult to determine whether or not the bits of a particular row 0 to n of memory 14 have been inverted or not. So, the pattern manufactured into memory 14 may be very different than the actual bit pattern and only the legitimate user is aware of which rows have been inverted. Although this security feature may be broken, it does provide security against optical reverse engineering since the pattern manufactured into memory 14 is not the exact program that is executed.

Mechanisms for hiding the reversion facility of the present invention may be as simple as not documenting the presence of the facility or its method of operation or as complex as requiring a specific, multi-step process for accessing the facility. Many such mechanisms have been used in the past to protect security features and may be readily adapted to protect the reversion facility.

For purposes of the present invention, the selective inversion performed by the data output reversion circuitry 80 may be considered as a logical reversion. Recall that selected portions of the bits comprising the intended pattern may be selectively inverted in accordance with the present invention prior to the manufacture of memory 14. By way of the presents invention, this selective inversion is reversed, as appropriate, to assure that accesses to the memory 14 will provide the originally intended bit patterns. In particular, the term reversion as used herein refers to the inversion operation performed by the data output reversion circuitry 80 under control, in the embodiment of FIG. 2, of the master reversion bit 75, in the embodiment of FIG. 4, of the row reversion bits 77, and, in the embodiment of FIG. 6, of the row reversions bits 77 as reverted by the reversion column reversion bit 202.

While the present invention has been illustrated and described with reference to specific embodiments, further modifications and improvements will occur to those skilled in the art. It is to be understood, therefore, that this invention is not limited to the particular forms illustrated and that the appended claims cover all modifications that do not depart from the spirit and scope of this invention.

What we claim is:

1. A precharge/discharge memory system, comprising:
   a memory array configured in rows and columns comprising:
   n column lines;
   n precharge circuits, each selectively precharging a respective one of the column lines;
   m row lines;
   m×n cell sites, each cell site located at an intersection of a respective one of the column and row lines;
   at least one transistor, located at a selected one of the cell sites, the transistor discharging the respective column line in response to an assertion of the respective row line; and
   n sense circuits, each selectively sensing a state of a respective one of the column lines and providing an output indicative thereof;
   n inverters, each inverter of the inverters having an input coupled to the output of a respective one of the sense circuits and providing an output inverse thereto; and
   n multiplexers, each multiplexer having a first input coupled to an output of a respective one of the inverters and a second input coupled to the output of a respective one of the sense circuits, and a third input coupled to receive a reversion signal, each multiplexer outputting a selected one of the first and second inputs in response to the reversion signal.

2. A memory as in claim 1, further comprising:
   a reversion circuit for selectively providing the reversion signal to the third input of each of the multiplexers.

3. A memory as in claim 2, wherein the reversion circuit comprises:
   an n+1st column line;
   an n+1th precharge circuit for selectively precharging the n+1st column line;
   a reversion row line intersecting the n+1st column line;
   a reversion cell site located at the intersection of the n+1st column line and the reversion row line; and
   an n+1st sense circuit, for selectively sensing the state of the n+1st column line and providing an output indicative thereof, said output comprising the reversion signal coupled to the third input of each of the plurality of multiplexers.

4. A memory as in claim 3, wherein the reversion circuit includes:

a reversion transistor, located at the reversion cell site, for discharging the n+1st column line in response to an assertion of the reversion row line.

5. A memory as in claim 4 wherein the reversion row line is asserted in response to the assertion of any one of the row lines of the memory array.

6. A memory as in claim 2, wherein the reversion circuit comprises:

an n+1st column line, intersecting each of the row lines of the memory array;

an n+1th precharge circuit for selectively precharging the n+1st column line;

m reversion cell sites, each located at an intersection of the n+1st column line and a respective one of the row lines; and an n+1st sense circuit, for selectively sensing a state of the n+1st column line and providing an output indicative thereof, said output comprising the reversion signal coupled to the third input of each of the multiplexers.

7. A memory as in claim 6, wherein the reversion circuit includes:

at least one reversion transistor, located at a respective one of the reversion cell sites, for discharging the n+1st column line in response to an assertion of the respective row line.

8. A memory as in claim 7, wherein the reversion circuit includes:

an n+1st inverter having an input coupled to the output of the n+1st sense circuit and providing an output inverse thereto; and a n+1st multiplexer having a first input coupled to the output of the n+1st inverter and a second input coupled to the output of the n+1st sense circuit, and a third input coupled to receive a reversion column reversion signal, the n+1st multiplexer outputting as said reversion signal a selected one of the first and second inputs in response to the reversion column reversion signal.

9. A memory as in claim 8, further comprising:

a reversion column reversion circuit for selectively providing the reversion column reversion signal to the third input of the n+1st multiplexer.

10. A memory as in claim 9, wherein the reversion column reversion circuit comprises:

an n+2nd column line;

an n+2nd precharge circuit for selectively precharging the n+2nd column line;

a reversion column reversion row line intersecting the n+2nd column line;

a reversion column reversion cell site located at the intersection of the n+2nd column line and the reversion column reversion row line; and an n+2nd sense circuit, for selectively sensing a state of the n+2nd column line and providing an output indicative thereof, said output comprising the reversion column reversion signal coupled to the third input of each of the plurality of multiplexers.

11. A memory as in claim 10, wherein the reversion column reversion circuit includes:

a reversion column reversion transistor, located at the reversion column reversion cell site, for discharging the n+2nd column line in response to an assertion of the reversion column reversion row line.

12. A memory as in claim 11 wherein the reversion column reversion row line is asserted in response to the assertion of any one of the row lines of the memory array.

13. A memory as in claim 2, wherein the reversion circuit comprises a bit in a control register.

14. A memory as in claim 13, wherein the bit is user programmable.

15. A memory as in claim 14, wherein the bit is hidden.

16. A memory as in claim 14, wherein the control register is hidden.

17. A method for reducing power dissipation in a precharge/discharge memory, the method comprising the steps of:

performing an analysis of a pattern of bits to be stored in the memory;

in response to the analysis, selectively inverting at least one bit of the pattern before the pattern is stored in the memory;

in response to inverting the one bit, asserting a reversion signal; and in response to the assertion of the reversion signal, selectively reverting the one bit upon output from the memory.

18. A method as in claim 17, wherein the analysis step further comprises:

determining a discharge ratio of number of bits of the pattern having a first state to a number of bits of the pattern having a second state; and wherein the inverting step further comprises:

in response to the discharge ratio exceeding a predetermined threshold, selectively inverting at least one of the bits of the pattern before the pattern is stored in the memory.

19. A method as in claim 18, wherein the discharge ratio is determined statically.

20. A method as in claim 18, wherein the discharge ratio is determined dynamically.

21. A method as in claim 18, wherein the discharge ratio is determined on the pattern as a whole, and, in response to the discharge ratio exceeding a predetermined threshold, all of the bits are inverted before the pattern is stored in the memory.

22. A method as in claim 18, wherein the discharge ratio is determined for each row of bits of the pattern, and, in response to the discharge ratio for a row exceeding a predetermined threshold, all of the bits of that row are inverted before the pattern is stored in the memory, the reversion signal being asserted for each inverted row and negated for each non-inverted row.

23. A method as in claim 22, further comprising the steps of:

determining a reversion ratio of the number of inverted rows to the number of non-inverted rows; and in response to the reversion ratio exceeding a predetermined threshold, inverting the reversion signal.

24. A method as in claim 23, wherein the reversion ratio is determined statically.

25. A method as in claim 23, wherein the reversion ratio is determined dynamically.

* * * * *